US010734765B2

(12) United States Patent
Hammond, Jr.

(10) Patent No.: US 10,734,765 B2
(45) Date of Patent: Aug. 4, 2020

(54) CONNECTOR WITH CAPACITIVE CROSSTALK COMPENSATION

(71) Applicant: COMMSCOPE TECHNOLOGIES LLC, Hickory, NC (US)

(72) Inventor: Bernard Harold Hammond, Jr., Cheltenham (GB)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 16/346,454

(22) PCT Filed: Oct. 30, 2017

(86) PCT No.: PCT/US2017/059047
§ 371 (c)(1),
(2) Date: Apr. 30, 2019

(87) PCT Pub. No.: WO2018/081712
PCT Pub. Date: May 3, 2018

(65) Prior Publication Data
US 2019/0305483 A1 Oct. 3, 2019

Related U.S. Application Data

(60) Provisional application No. 62/415,058, filed on Oct. 31, 2016.

(51) Int. Cl.
*H01R 24/00* (2011.01)
*H01R 13/6466* (2011.01)
(Continued)

(52) U.S. Cl.
CPC ..... *H01R 13/6466* (2013.01); *H01R 13/6474* (2013.01); *H01R 24/64* (2013.01); *H05K 1/0213* (2013.01); *H05K 2201/10189* (2013.01)

(58) Field of Classification Search
CPC .............. H01R 13/6658; H01R 23/025; H01R 23/005; H05K 2201/10689; H01L 2924/01079
(Continued)

(56) References Cited

U.S. PATENT DOCUMENTS 5,997,385 A 12/1999 Nishio
6,165,018 A 12/2000 Arnett et al.
(Continued)

FOREIGN PATENT DOCUMENTS

CA 2310345 C 11/2004
CA 2551490 A1 1/2007
(Continued)

OTHER PUBLICATIONS

International Search Report and Written Opinion of the International Searching Authority for International Patent Application No. PCT/US2017/059047 dated Feb. 7, 2018, 14 pages.

*Primary Examiner* — Thanh Tam T Le
(74) *Attorney, Agent, or Firm* — Merchant & Gould P.C.

(57) ABSTRACT

A telecommunications connector includes a housing defining a port for receiving a plug. A circuit board has a first conductive layer and a second conductive layer, with a dielectric layer situated between the first and second conductive layers. A plurality of conductive vias extend through the circuit board, and receive a plurality of electrical connection members and a plurality of wire termination contacts. A plurality of conductive tracks electrically interconnect selected ones of the plurality of conductive vias so as to electrically connect the plurality of electrical connection members and the plurality of wire termination contacts. A crosstalk compensation arrangement provides crosstalk compensation between selected conductive tracks of the circuit board. The crosstalk compensation arrangement includes a first capacitive coupling having a first conductive plate on the first conductive layer and a second conductive (Continued)

plate on the second conductive layer, and a first one of the conductive vias is at least partially surrounded by the first conductive plate. The first conductive plate on the first conductive layer may further form a second capacitive coupling with third conductive plate on the second conductive layer.

24 Claims, 12 Drawing Sheets (51) Int. Cl.
*H01R 13/6474* (2011.01)
*H01R 24/64* (2011.01)
*H05K 1/02* (2006.01)

(58) Field of Classification Search
USPC ......... 439/76.1, 676, 941; 174/261; 361/777
See application file for complete search history.

(56) References Cited

U.S. PATENT DOCUMENTS

| | | | |
|---|---|---|---|
| 6,186,834 B1 | 2/2001 | Arnett et al. | |
| 6,217,392 B1 | 4/2001 | Chen et al. | |
| 6,346,010 B1 | 2/2002 | Emplit | |
| 6,379,157 B1 | 4/2002 | Curry et al. | |
| 6,431,918 B1 | 8/2002 | Givens et al. | |
| 6,464,529 B1 | 10/2002 | Jensen et al. | |
| 7,052,328 B2 | 5/2006 | Ciezak et al. | |
| 7,140,924 B2 | 11/2006 | Redfield et al. | |
| 7,153,168 B2 | 12/2006 | Caveney et al. | |
| 7,179,131 B2 | 2/2007 | Caveney et al. | |
| 7,182,649 B2 | 2/2007 | Caveney et al. | |
| 7,252,554 B2 | 8/2007 | Caveney et al. | |
| 7,281,957 B2 | 10/2007 | Caveney et al. | |
| 7,285,025 B2 | 10/2007 | Denovich et al. | |
| 7,294,025 B1 | 11/2007 | Chen | |
| 7,309,261 B2 | 12/2007 | Caveney et al. | |
| 7,317,318 B2 | 1/2008 | Jackson | |
| 7,357,683 B2 | 4/2008 | Caveney et al. | |
| 7,381,098 B2* | 6/2008 | Hammond, Jr. | H01R 13/719 439/676 |
| 7,384,315 B2 | 6/2008 | Caveney et al. | |
| 7,402,085 B2* | 7/2008 | Hammond, Jr. | H01R 13/6658 439/676 |
| 7,442,092 B2 | 10/2008 | Caveney et al. | |
| 7,459,640 B2* | 12/2008 | Adriaenssens | H05K 1/0228 174/258 |
| 7,481,681 B2 | 1/2009 | Caveney et al. | |
| 7,520,784 B2 | 4/2009 | Caveney et al. | |
| 7,530,854 B2 | 5/2009 | Aekins | |
| 7,544,888 B2 | 6/2009 | Caveney et al. | |
| 7,591,689 B2 | 9/2009 | Caveney et al. | |
| 7,618,296 B2 | 11/2009 | Caveney | |
| 7,658,648 B2 | 2/2010 | Aekins | |
| 7,658,651 B2* | 2/2010 | Pepe | H01R 13/6658 174/261 |
| 7,677,931 B2 | 3/2010 | Aekins | |
| 7,726,018 B2 | 6/2010 | Caveney et al. | |
| 7,780,480 B2 | 8/2010 | Caveney | |
| 7,823,281 B2 | 11/2010 | Caveney et al. | |
| 7,841,909 B2* | 11/2010 | Murray | H01R 13/6691 439/676 |
| 7,874,879 B2 | 1/2011 | Caveney et al. | |
| 7,909,657 B1 | 3/2011 | Abughazaleh et al. | |
| 7,927,153 B2 | 4/2011 | Straka et al. | |
| 7,976,348 B2 | 7/2011 | Aekins et al. | |
| 7,980,901 B2 | 7/2011 | Caveney | |
| 8,002,590 B2 | 8/2011 | Ciezak et al. | |
| 8,011,972 B2 | 9/2011 | Caveney et al. | |
| 8,052,474 B2 | 11/2011 | Fite et al. | |
| 8,128,433 B2 | 3/2012 | Schempp et al. | |
| 8,128,437 B2 | 3/2012 | Straka et al. | |
| 8,137,141 B2* | 3/2012 | Straka | H05K 1/0228 439/676 |
| 8,157,600 B2 | 4/2012 | Ciezak et al. | |
| 8,202,128 B2* | 6/2012 | Hammond, Jr. | H05K 1/0228 439/676 |
| 8,272,902 B2 | 9/2012 | Straka et al. | |
| 8,282,424 B2 | 10/2012 | Weinmann et al. | |
| 8,342,889 B2 | 1/2013 | Straka et al. | |
| 8,485,850 B2 | 7/2013 | Nesme et al. | |
| 8,632,367 B2 | 1/2014 | Caveney et al. | |
| 8,641,452 B2 | 2/2014 | Patel et al. | |
| 8,826,532 B2 | 9/2014 | Caveney et al. | |
| 8,931,167 B2 | 1/2015 | Abughazaleh et al. | |
| 8,936,494 B2 | 1/2015 | Weinmann et al. | |
| 9,088,116 B2 | 7/2015 | Bolouri-Saransar et al. | |
| 9,106,021 B2 | 8/2015 | Patel et al. | |
| 9,118,134 B2 | 8/2015 | Babu et al. | |
| 9,136,647 B2 | 9/2015 | Straka et al. | |
| 9,246,274 B2 | 1/2016 | Valenti et al. | |
| 9,246,463 B2 | 1/2016 | Devine et al. | |
| 9,318,840 B2 | 4/2016 | Siev et al. | |
| 9,356,396 B2 | 5/2016 | Bolouri-Saransar et al. | |
| 9,407,044 B2 | 8/2016 | Caveney et al. | |
| 9,768,556 B2* | 9/2017 | Bopp | H01R 24/64 |
| 2004/0137799 A1 | 7/2004 | Ciezak et al. | |
| 2005/0277339 A1 | 12/2005 | Caveney et al. | |
| 2006/0014410 A1 | 1/2006 | Caveney et al. | |
| 2006/0160428 A1 | 7/2006 | Hashim | |
| 2007/0184724 A1 | 8/2007 | Adriaenssens et al. | |
| 2007/0243728 A1 | 10/2007 | Ellis et al. | |
| 2008/0268710 A1 | 10/2008 | Hashim et al. | |
| 2008/0311778 A1 | 12/2008 | Aekins | |
| 2009/0269978 A1 | 10/2009 | Pepe et al. | |
| 2010/0136835 A1 | 6/2010 | Hashim et al. | |
| 2010/0223786 A1 | 9/2010 | Caveney et al. | |
| 2011/0183547 A1 | 7/2011 | Straka et al. | |
| 2011/0275247 A1 | 11/2011 | Straka et al. | |
| 2012/0190249 A1 | 7/2012 | Ciezak et al. | |
| 2014/0273633 A1 | 9/2014 | Gatnau et al. | |
| 2014/0273634 A1 | 9/2014 | Bopp et al. | |
| 2015/0004849 A1 | 1/2015 | Caveney et al. | |
| 2015/0126074 A1 | 5/2015 | Abughazaleh et al. | |
| 2015/0325965 A1 | 11/2015 | Babu et al. | |
| 2015/0349463 A1 | 12/2015 | Patel et al. | |
| 2016/0111822 A1 | 4/2016 | Patel | |
| 2016/0226193 A1 | 8/2016 | Siev et al. | |
| 2016/0254620 A1 | 9/2016 | O'Young | |
| 2016/0268740 A1 | 9/2016 | Schumacher | |

FOREIGN PATENT DOCUMENTS

| | | |
|---|---|---|
| CA | 2733598 A1 | 2/2010 |
| CA | 2718216 A1 | 5/2011 |
| CA | 2547029 C | 10/2012 |
| CA | 2782486 A1 | 12/2013 |
| CA | 2889236 A1 | 1/2014 |

* cited by examiner

CONNECTOR WITH CAPACITIVE CROSSTALK COMPENSATION

CROSS-REFERENCE TO RELATED APPLICATION

This application is a National Stage Patent Application of PCT/US2017/059047, filed on Oct. 30, 2017, which claims the benefit of U.S. Patent Application Ser. No. 62/415,058, filed on Oct. 31, 2016, the disclosures of which are incorporated herein by reference in in their entireties. To the extent appropriate, a claim of priority is made to each of the above disclosed applications.

TECHNICAL FIELD

The present disclosure relates generally to telecommunications equipment. More particularly, the present disclosure relates to telecommunications connectors that are configured to incorporate capacitive crosstalk compensation to reduce crosstalk generated from such a connector.

BACKGROUND

Electrical connectors, such as modular jacks and modular plugs, are commonly used in telecommunications systems. Such connectors may be used to provide interfaces between successive runs of cable in telecommunications systems and between cables and electronic devices. Electrical connectors may include contacts that are arranged according to know industry standards, such as Electronics Industries Alliance/Telecommunications Industry Association ("EIA/TIA")-568.

In the field of data communications, communications networks typically utilize techniques designed to maintain or improve the integrity of signals being transmitted via the network ("transmission signals"). To protect signal integrity, the communications networks should, at a minimum, satisfy compliance standards that are established by standards committees, such as the Institute of Electrical and Electronics Engineers (IEEE). The compliance standards help network designers provide communications networks that achieve at least minimum levels of signal integrity as well as some standard of compatibility.

One prevalent type of communication system uses twisted pairs of wires to transmit signals. In twisted pair systems, information such as video, audio and data are transmitted in the form of balanced signals over a pair of wires. The transmitted signal is defined by the voltage difference between the wires.

Crosstalk can negatively affect signal integrity in twisted pair systems. Crosstalk is unbalanced noise caused by capacitive and/or inductive coupling between wires and a twisted pair system. Crosstalk can exist in many variants, including near end crosstalk, far end crosstalk, and alien crosstalk. Near end crosstalk refers to crosstalk detected at the same end of a wire pair as the inductance/capacitance causing it, while far end crosstalk refers to crosstalk resulting from inductance/capacitance at a far end of a wire pair. Alien crosstalk refers to crosstalk that occurs between different cables (i.e. different channels) in a bundle, rather than between individual wires or circuits within a single cable. Alien crosstalk can be introduced, for example, at a multiple connector interface. With increasing data transmission speeds, increasing alien crosstalk is generated among cables, and must be accounted for in designing systems in which compensation for the crosstalk is applied. The effects of all crosstalk become more difficult to address with increased signal frequency ranges.

The effects of crosstalk also increase when transmission signals are positioned closer to one another. Consequently, communications networks include areas that are especially susceptible to crosstalk because of the proximity of the transmission signals. In particular, communications networks include connectors that bring transmission signals in close proximity to one another. For example, the contacts of traditional connectors (e.g., jacks and plugs) used to provide interconnections in twisted pair telecommunications systems are particularly susceptible to crosstalk interference. Furthermore, alien crosstalk has been observed that could not be explained by the current models which sum connector and cable component results to calculate channel results. This "excess" alien crosstalk is not compensated for in existing designs.

Figure 1:
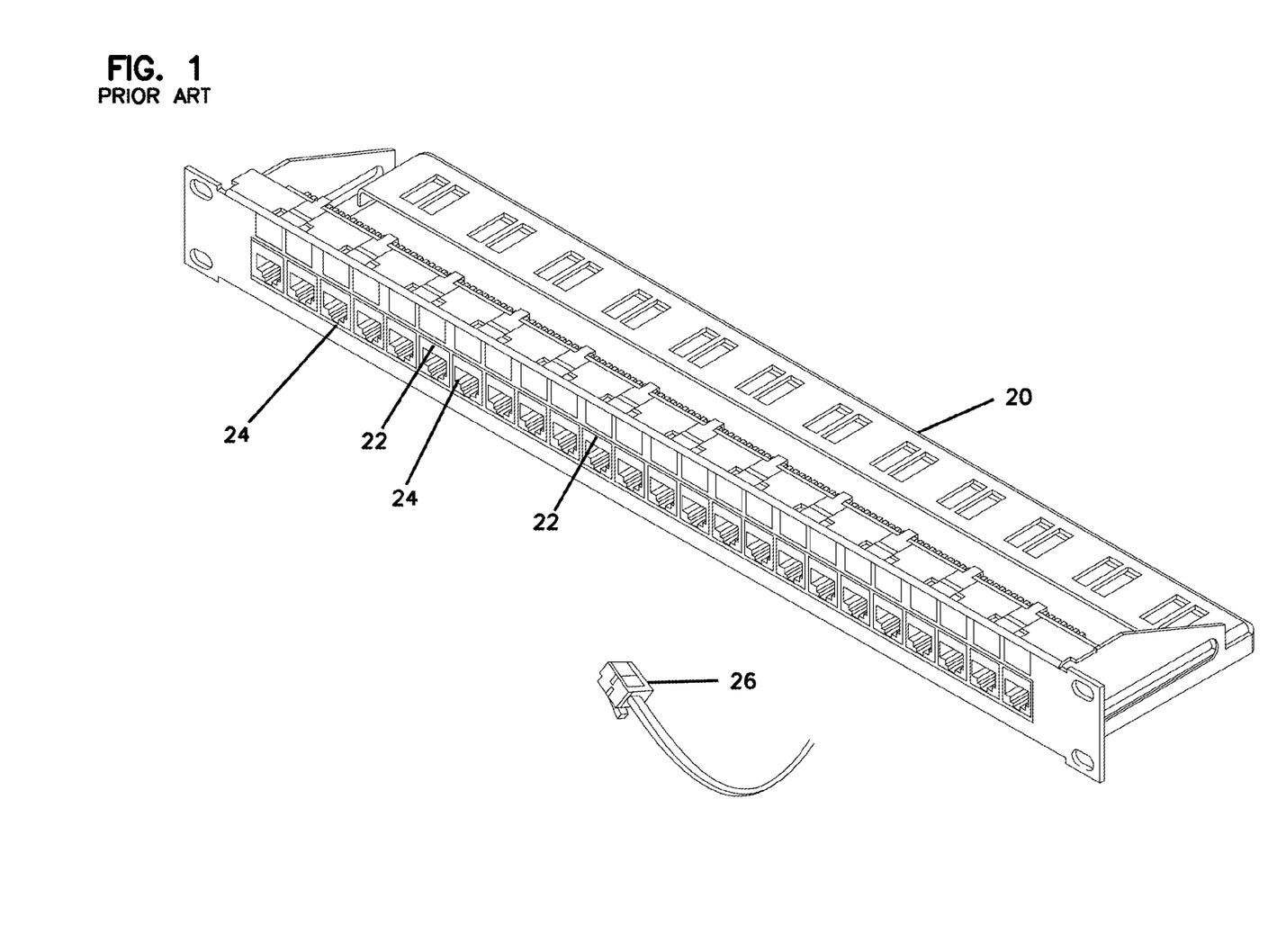
FIG. 1 illustrates a prior art patch panel having modular RJ-45 jacks.
Figure 2:
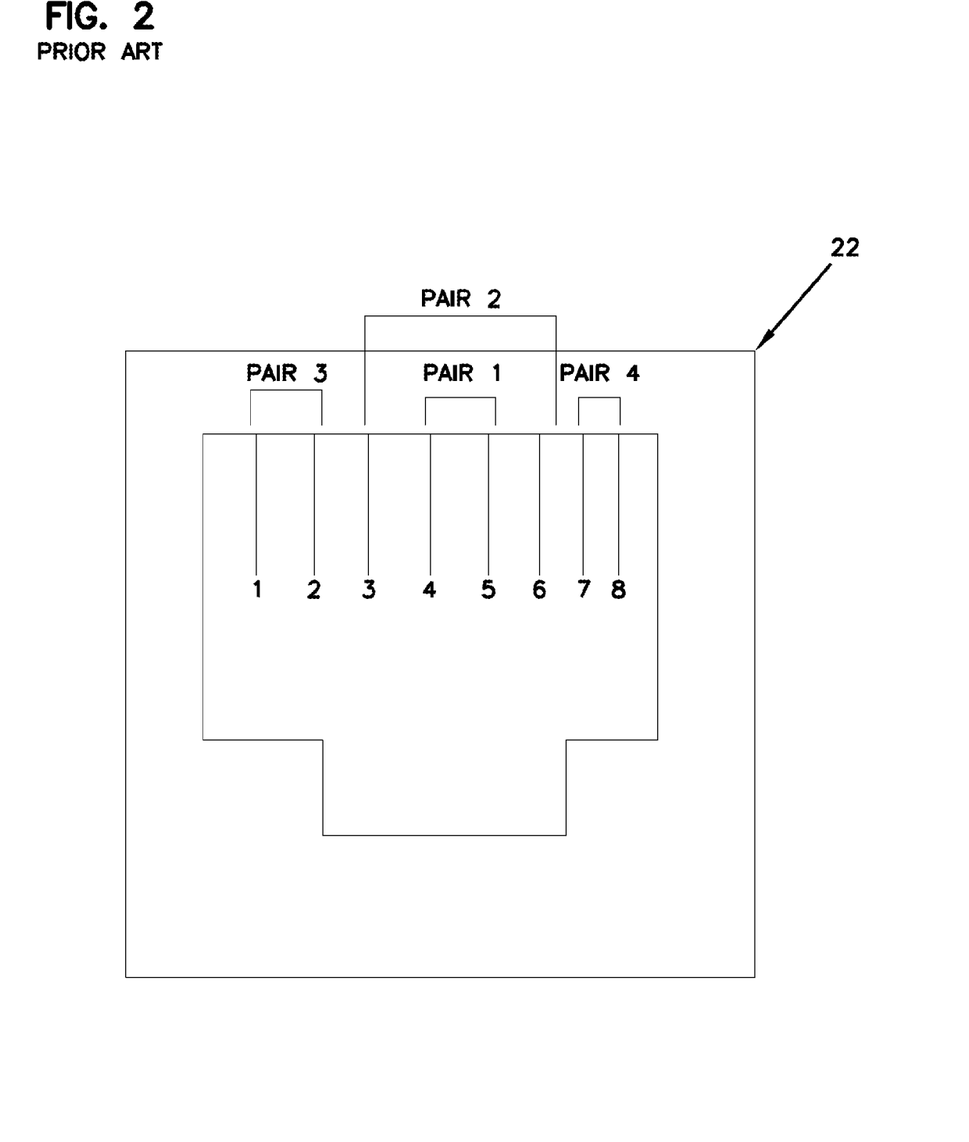
FIG. 2 schematically depicts a contact layout for a standard modular RJ-24 jack.
Figure 3:
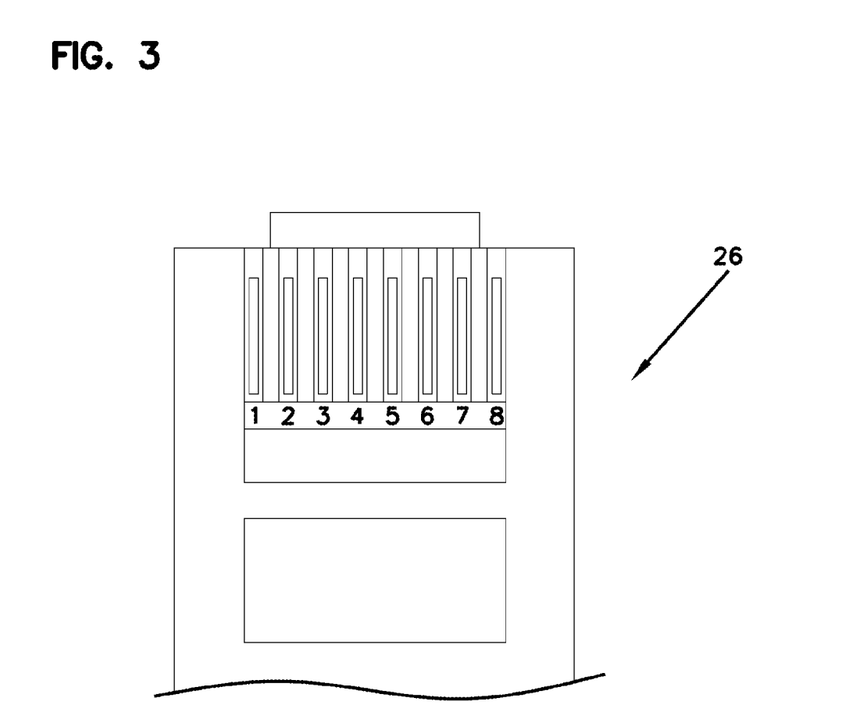
FIG. 3 schematically illustrates a conventional pin layout for a standard RJ-45 jack.

FIG. 1 shows a prior art panel 20 adapted for use with a twisted pair telecommunications system. The panel 20 includes a plurality of jacks 22. Each jack 22 includes a port 24 adapted to receive a standard telecommunications plug 26. Each of the jacks 22 is adapted to be terminated to four twisted pairs of transmission wires. As shown at FIG. 2, each of the jacks 22 includes eight contact springs labeled as having positions 1-8. In use, contact springs 4 and 5 are connected to a first pair of wires, the contact springs 3 and 6 are connected to a second pair of wires, contact springs 1 and 2 are connected to a third pair of wires, and contact springs 7 and 8 are connected to a fourth pair of wires. As shown at FIG. 3, a typical plug 26 also has eight contacts (labeled 1-8) adapted to interconnect with the corresponding eight contacts of the jack 22 when the plug is inserted within the port 24.

To promote circuit density, the contacts of the jacks and the plugs are required to be positioned in fairly close proximity to one another. Thus, the contact regions of the jacks and plugs are particularly susceptible to crosstalk. Furthermore, certain pairs of contacts are more susceptible to crosstalk than others. For example, the first and third pairs of contacts in the plugs and jacks are typically most susceptible to crosstalk.

To address the problems of crosstalk, jacks have been designed with contact spring configurations adapted to reduce the capacitive coupling generated between the contact springs so that crosstalk is minimized. An alternative approach involves intentionally generating crosstalk having a magnitude and phase designed to compensate for or correct crosstalk caused at the plug or jack. Typically, crosstalk compensation can be provided by manipulating the positioning of the contacts or leads of the jack or can be provided on a circuit board used to electrically connect the contact springs of the jack to insulation displacement connectors of the jack.

The telecommunications industry is constantly striving toward larger signal frequency ranges. As transmission frequency ranges widen, crosstalk becomes more problematic. Thus, there is a need for further development relating to crosstalk remediation.

SUMMARY

One aspect of the present disclosure relates to a telecommunications connector. The telecommunications connector includes a housing defining a port for receiving a plug. A circuit board has a first conductive layer and a second conductive layer, with a dielectric layer situated between the first and second conductive layers. A plurality of conductive vias extend through the circuit board, and receive a plurality of electrical connection members and a plurality of wire termination contacts. A plurality of conductive tracks electrically interconnect selected ones of the plurality of conductive vias so as to electrically connect the plurality of electrical connection members and the plurality of wire termination contacts. A crosstalk compensation arrangement provides crosstalk compensation between selected conductive tracks of the circuit board. In some examples, the crosstalk compensation arrangement includes a first capacitive coupling having a first conductive plate on the first conductive layer and a second conductive plate on the second conductive layer, and a first one of the conductive vias is at least partially surrounded by the first conductive plate.

Another aspect of the present disclosure relates to a telecommunications connector that includes a housing defining a port for receiving a plug. A circuit board has a first conductive layer and a second conductive layer, with a dielectric layer situated between the first and second conductive layers. A plurality of conductive vias extend through the circuit board, and receive a plurality of electrical connection members and a plurality of wire termination contacts. A plurality of conductive tracks electrically interconnect selected ones of the plurality of conductive vias so as to electrically connect the plurality of electrical connection members and the plurality of wire termination contacts. A cross-talk compensation arrangement for applying capacitance between at least some of the conductive tracks includes a first capacitive coupling formed by a first conductive plate on the first conductive layer and a second conductive plate on the second conductive layer, and a second capacitive coupling formed by the first conductive plate and a third conductive plate on the second conductive layer.

A variety of additional inventive aspects will be set forth in the description that follows. The inventive aspects can relate to individual features and to combinations of features. It is to be understood that both the foregoing general description and the following detailed description are exemplary and explanatory only and are not restrictive of the broad inventive concepts upon which the embodiments disclosed herein are based.

DETAILED DESCRIPTION

Figure 4:
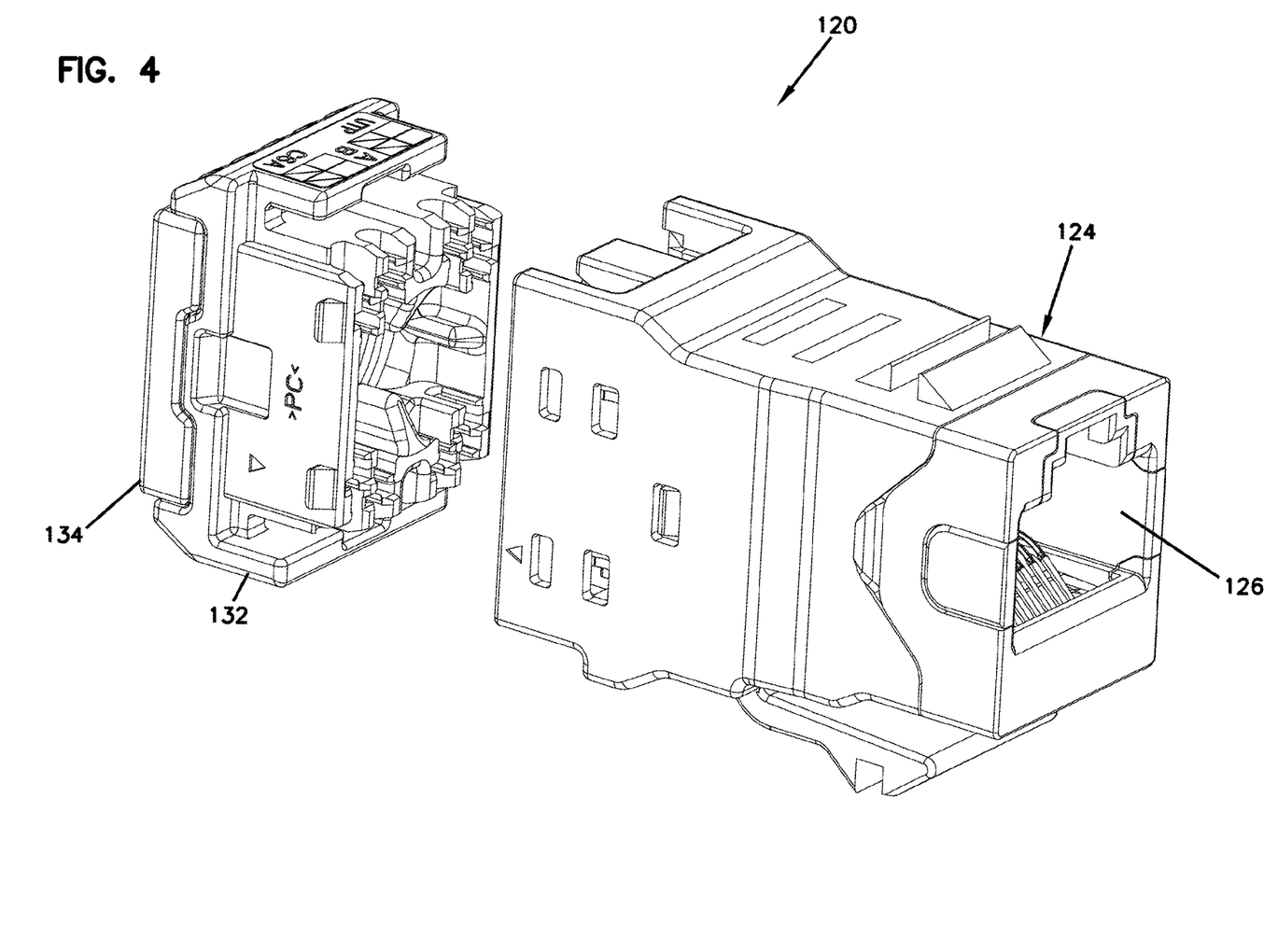
FIG. 4 is a front, partially exploded view of a telecommunications jack in accordance with the principles of the present disclosure.
Figure 5:
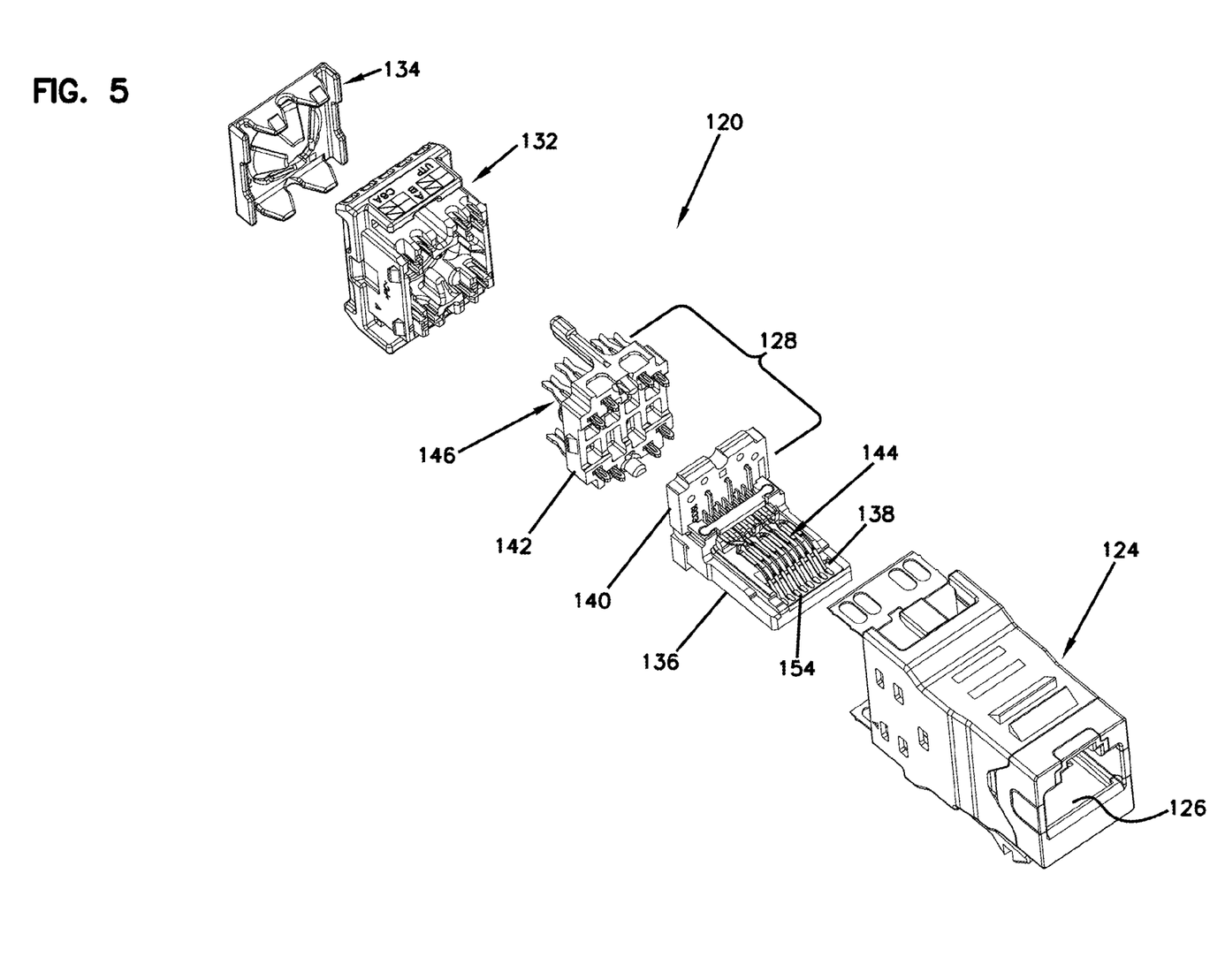
FIG. 5 is a front, more fully exploded view of the telecommunications jack of FIG. 4.

FIGS. 4 and 5 show a modular telecommunications jack 120 in accordance with the principles of the present disclosure. The telecommunications jack 120 is adapted to mate and electrically connect with a corresponding telecommunications plug 122 (see FIG. 8). In the depicted example, the telecommunications jack 120 and telecommunications plug 122 have a standard RJ-45 form factor and pin configuration. However, the subject matter described and/or illustrated herein is applicable to other types of electrical connectors whether the electrical connectors are modular jacks, modular plugs, or any other type of electrical connector.

Referring to FIG. 5, the telecommunications jack 120 includes a front housing 124 having a front port 126 that is keyed and sized to receive the telecommunications plug 122. The telecommunications jack 120 also includes a circuit insert assembly 128 that mounts (e.g., snap-fits) within the front housing 124 and a rear housing 132 that mounts adjacent to a rear side of the circuit insert assembly 128. The telecommunications jack 120 further includes a wire manager 134 that mounts to a rear side of the rear housing 134.

Figure 7:
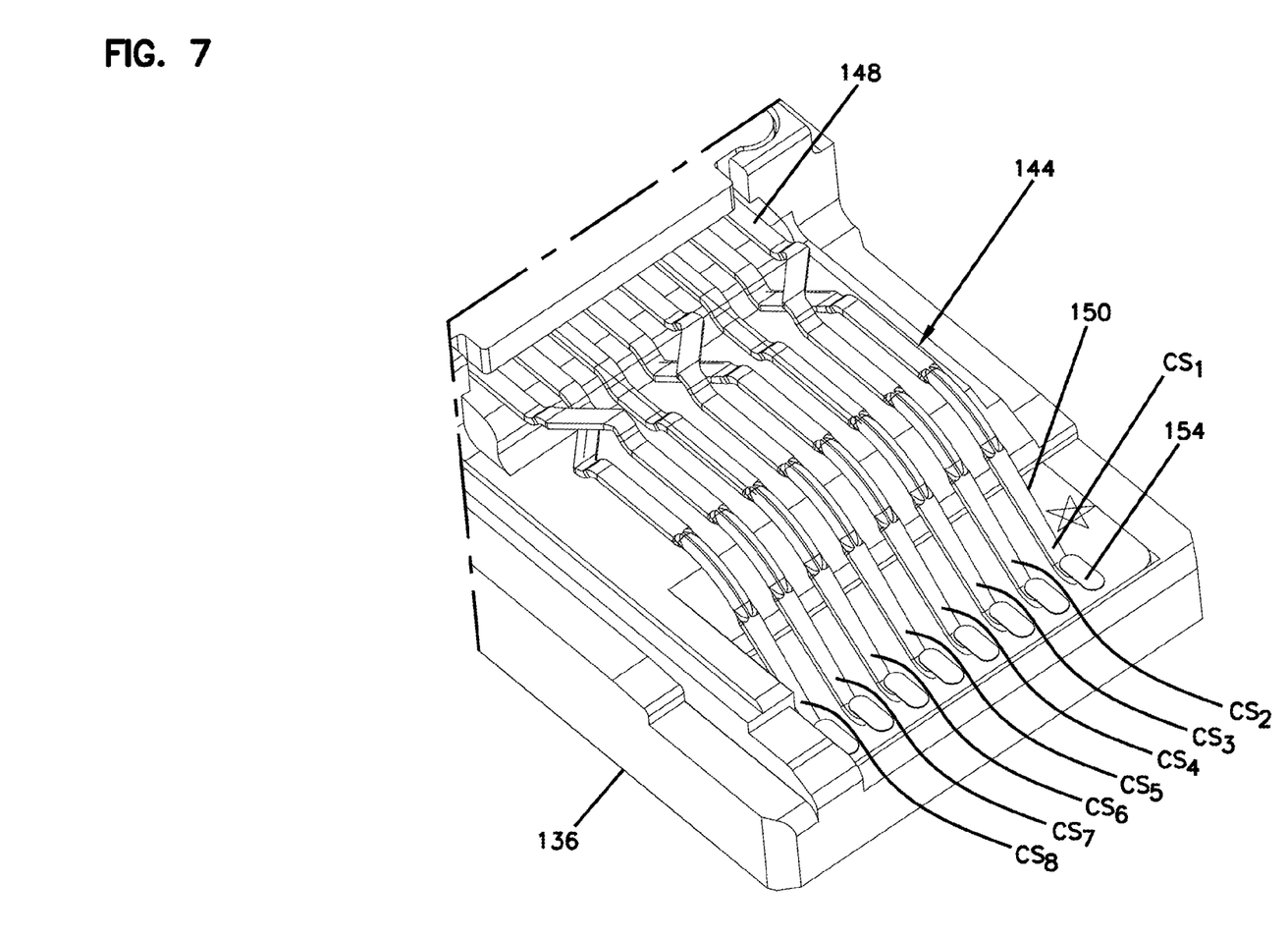
FIG. 7 is an enlarged view of a contact spring arrangement of the circuit insert assembly of FIG. 6.

The circuit insert assembly 128 includes a dielectric base 136, a first circuit board 138 (e.g., a horizontal circuit board) supported on the dielectric base 136, a second circuit board 140 (e.g., a vertical circuit board) arranged in an angle (e.g., a perpendicular angle) relative to the first circuit board 138, and a termination support 142 mounted to a back side of the second circuit board 140. The circuit insert assembly 128 also includes contact springs 144 and wire termination structures 146. The contact springs 144 include eight contact springs numbered $CS_1$-$CS_8$ (see FIG. 7). The wire termination structures 146 are depicted as insulation displacement connectors (IDC) but could be other types of wire termination structures such as wire wraps or pins. The contact springs 144 include fixed ends 148 and free ends 150. The fixed ends 148 are anchored relative to the dielectric base 136 and are electrically connected to the second circuit board 140 by an electrical connection member 152 (see FIG. 8). The free ends 150 of the contact spring 144 engage top conductive pads 154 (see FIG. 7) provided at a top side of the first circuit board 138. The electrical connector members 152 and conductive traces provided on the second circuit board 140 function to electrically connect each of the contact springs $CS_1$-$CS_8$ to a respective one of the wire termination structures $IDC_1$-$IDC_8$. The electrical connection members 152 also function to electrically connect selected ones of the contact springs 144 (e.g., contact springs $CS_2$, $CS_4$ and $CS_7$) to respective bottom conductive pads 156 provided at a bottom side of the first circuit board 138. The electrical connection members 152 can also function to mechanically connect the dielectric base 136 to the second circuit board 140.

The rear housing 132 of the telecommunications jack 120 can be configured to mount adjacent to the back side of the termination support 142. In one example, the rear housing 132 is configured to house the wire contact structures 146. In one example, the rear housing 132 can snap-fit to the front housing 124 at a location behind the termination support 142.

The circuit insert assembly 128 is loaded into the front housing 124 by inserting the circuit insert assembly 128 into the front housing 124 through a rear end 158 of the front housing 124. When the circuit insert assembly 128 is fully loaded and retained within the front housing 124, the contact springs $CS_1$-$CS_8$ are positioned so as to be accessible at the front port 126. In this way, when the telecommunications plug 122 is inserted within the front port 126, paired contacts of the telecommunications plug 122 engage and are electrically connected to corresponding contact springs $CS_1$-$CS_8$ of the jack 120. After the circuit insert assembly 128 is snapped within the front housing 124, the rear housing 132 can be snapped in place. Alternatively, the rear housing 132 and the circuit insert assembly 128 can be secured together and then loaded into the front housing 124 as a unit.

The electrical connection members 152 include a plurality of electrical connection members $ECM_1$-$ECM_8$ that respectfully correspond to the contact springs $CS_1$-$CS_8$ and the wire termination structures $IDC_1$-$IDC_8$. It will be appreciated that the second circuit board 140 can include a multi-layer construction having conductive paths (e.g., circuit tracings, tracks) that electrically connect the electrical connection members $ECM_1$-$ECM_8$ respectively to the wire termination structures $IDC_1$-$IDC_8$. A layout of the electrical connection members $ECM_1$-$ECM_8$ and the wire termination structures $IDC_1$-$IDC_8$ on the second circuit board 140 is shown at FIGS. 10-14.

Figure 6:
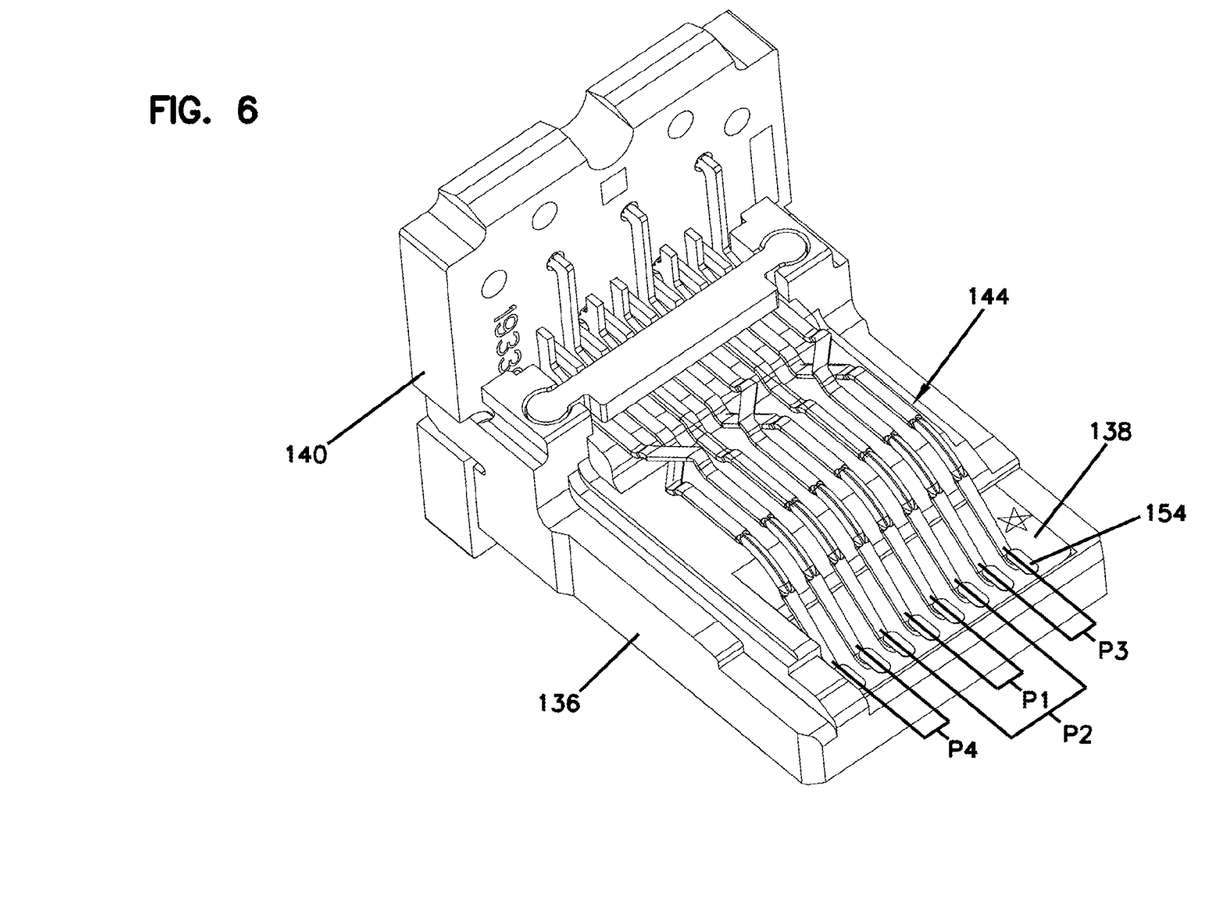
FIG. 6 is a front, perspective view of a circuit insert assembly of the telecommunications jack of FIG. 5.

In use, wires are electrically connected to the electrical connection members $ECM_1$-$ECM_8$ by inserting the wires between pairs of the insulation displacement connector blades $IDC_1$-$IDC_8$. When the wires are inserted between pairs of the insulation displacement connector blades $IDC_1$-$IDC_8$, the blades cut through the insulation of the wires and make electrical contact with the center conductors of the wires. In this way, the insulation displacement connector blades $IDC_1$-$IDC_8$, which are electrically connected to the electrical connection members $ECM_1$-$ECM_8$ by the tracks on the circuit board, provide an efficient means for electrically connecting a twisted pair of wires to the electrical connection members $ECM_1$-$ECM_8$ of the jack 120. In certain examples, the arrangement of contact springs 144 may be at least partially determined by industry standards, such as, but not limited to, International Electrotechnical Commission (IEC) 60603-7 or Electronics Industries Alliance/Telecommunications Industry Association (EIA/TIA)-568. In certain examples, the contact springs 144 include eight contact springs arranged as differential pairs P1-P4 (see FIG. 6). Each differential pair P1-P4 may consist of two paired contact springs 144 in which one contact spring 144 of the pair transmits a current signal and the other contact spring 144 of the pair transmits a current signal that is 180 degrees out of phase with the paired contact spring. By convention, the differential pair P1 includes contact springs $CS_4$ and $CS_5$; the differential pair P2 includes contact springs $CS_3$ and $CS_6$; the differential pair P3 includes contact springs $CS_1$ and $CS_2$; and the differential pair P4 includes contact springs $CS_7$ and $CS_8$.

The telecommunications jack 120 includes structure for compensating for crosstalk (e.g., near end crosstalk and/or far end crosstalk). For example, compensating capacitance can be provided by forming discrete capacitors that are integrated within the first circuit board 138 and/or the second circuit board 140 to provide discrete capacitive coupling locations. In one example, capacitive couplings for compensating for crosstalk are provided primarily by discrete capacitive couplings provided at the second circuit board 140.

It will be appreciated that in a telecommunications jack, there is limited space for providing the required levels of capacitance needed to fully address and remedy offending crosstalk. In this regard, aspects of the present disclosure relate to features for enhancing the effective use of space within the jack, for example, providing capacitive couplings using capacitors that are as electrically short as possible and close to one or more of the electrical connection members $ECM_1$-$ECM_8$.

In some examples, a single conductive plate on one layer of the circuit board 140 is used to create two capacitors to create a first compensation stage for all the 3-6 wire pair combinations. A thin circuit board laminent may be used to create the capacitors, further keeping the capacitors compact to aid in shortening their electrical length.

Figure 10:
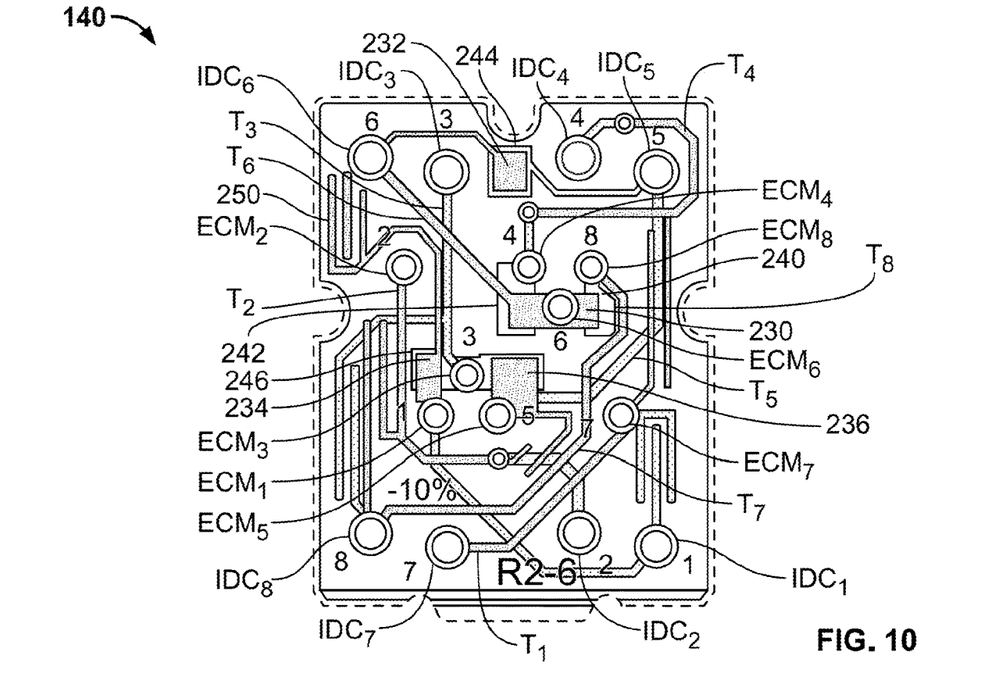
FIG. 10 shows an overall conductive pathway layout of a compensation circuit board of the telecommunications jack of FIGS. 4 and 5.
Figure 11:
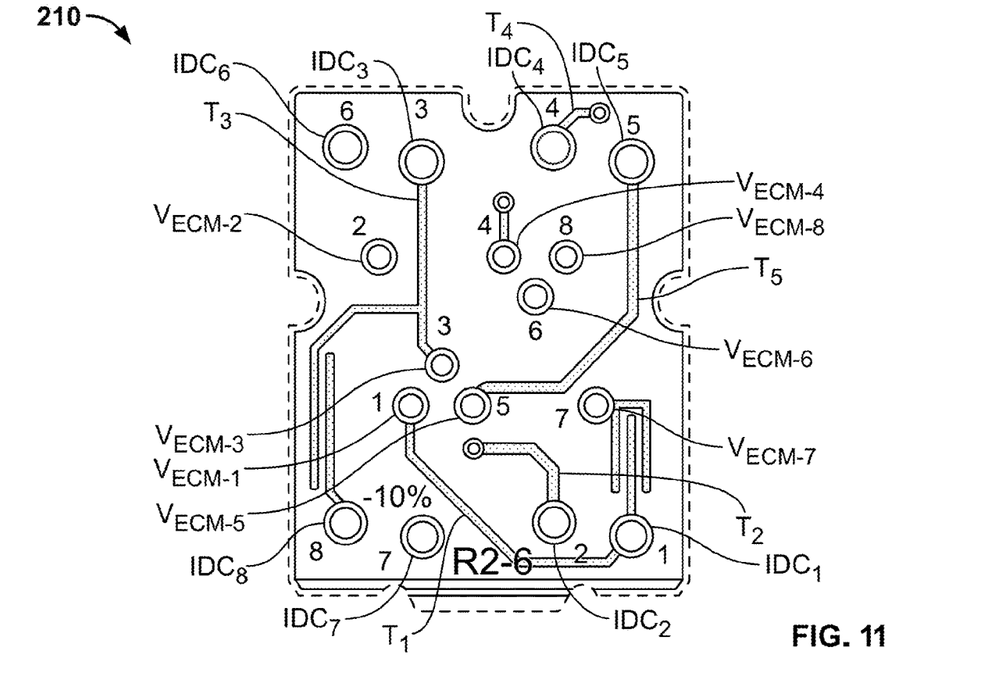
FIG. 11 shows a conductive pathway layout for a top layer of the compensation circuit board of FIG. 10.
Figure 12:
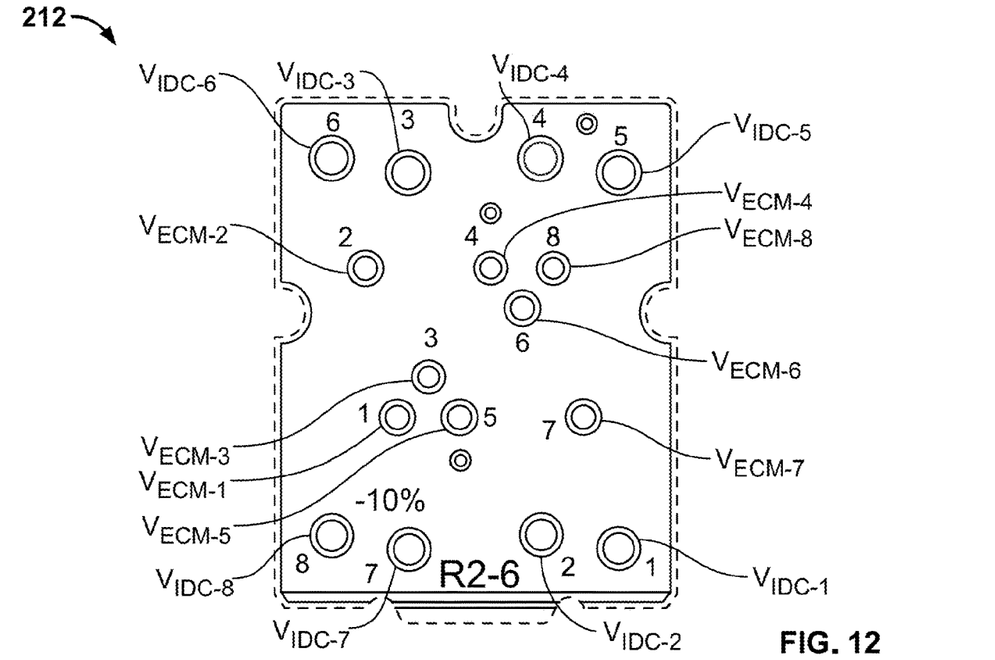
FIG. 12 shows a conductive pathway layout for a tom-middle layer of the compensation circuit board of FIG. 10.

FIGS. 10-14 illustrate an example of the circuit board 140. The illustrated example circuit board 140 is a multiple layer circuit board. FIG. 10 is an all layers view of the circuit board 140. FIGS. 11-14 illustrate a top conductive layer 210, a top-middle conductive layer 212, a bottom-middle conductive layer 214, and a bottom conductive layer 216, respectively, of the circuit board 140. FIG. 15 is a sectional side view conceptually illustrating portions of the circuit board 140, showing the first (bottom) conductive layer 216 and the second (bottom middle) conductive layer 214 separated by a dielectric 220.

Figure 8:
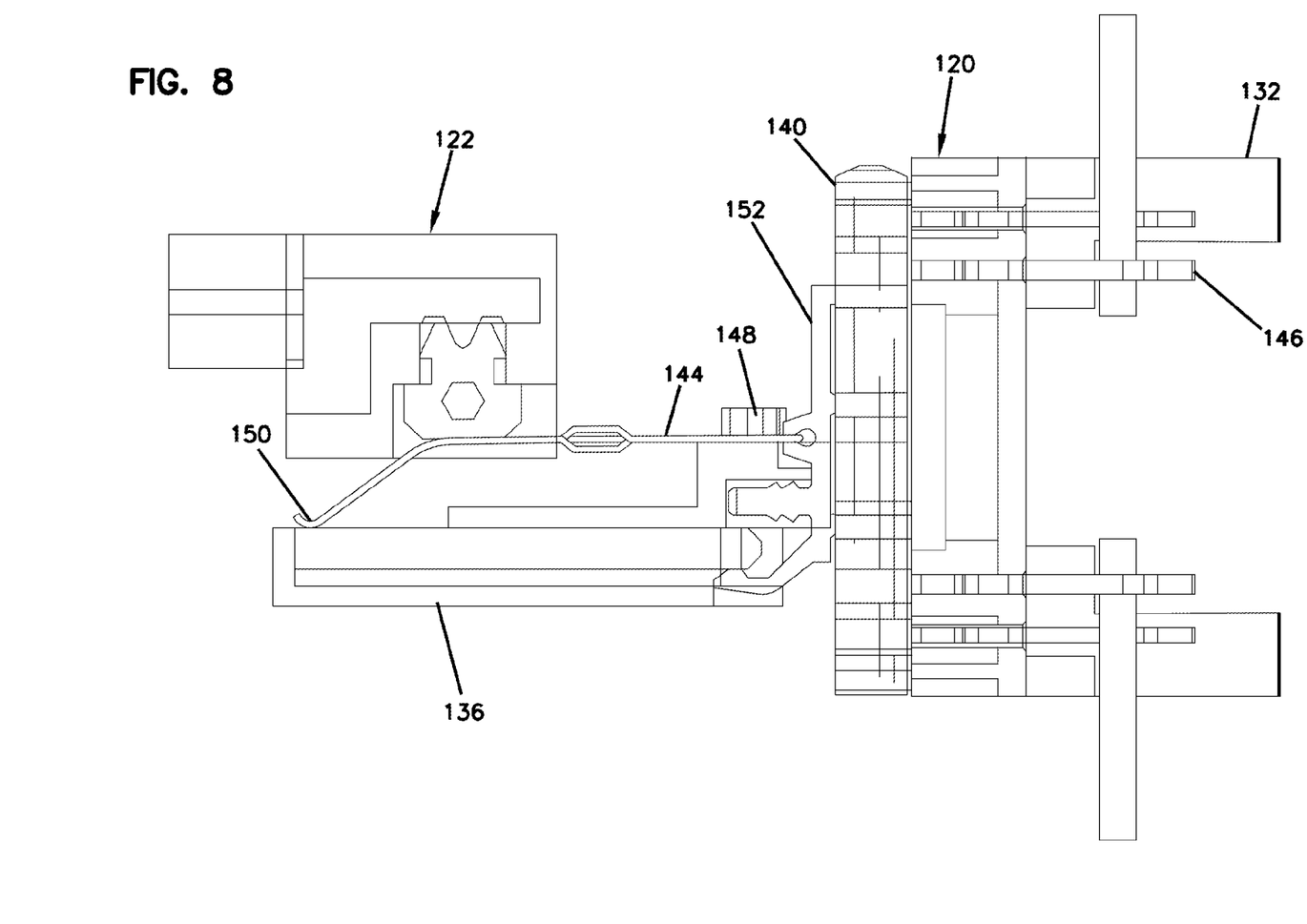
FIG. 8 is a schematic view showing the telecommunications jack of FIGS. 4 and 5 mated with a telecommunications plug.
Figure 9:
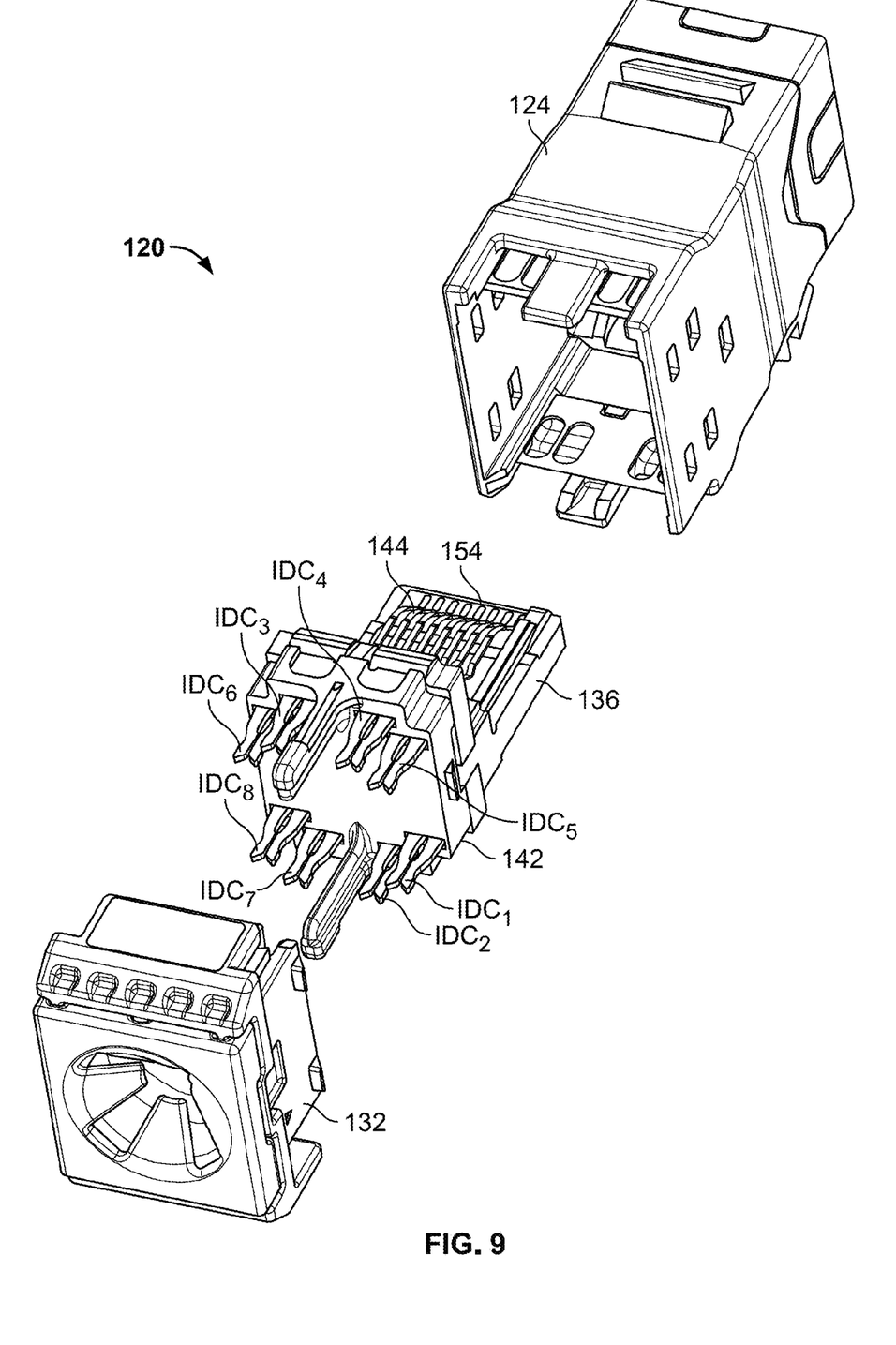
FIG. 9 is a rear, exploded view of the telecommunications jack of FIGS. 4 and 5.

The electrical connection members $ECM_1$-$ECM_8$ are received by corresponding vias $V_{ECM-1}$-$V_{ECM-8}$ such that the electrical connection members 152 extend from the bottom, or first, layer 216 of the circuit board 140 as shown in FIG. 8. The insulation displacement connector blades $IDC_1$-$IDC_8$ are received by vias $V_{IDC-1}$-$V_{IDC-8}$ such that the $IDC_8$ 146 extend from the opposite, or top layer 210. The vias $V_{ECM-1}$-$V_{ECM-8}$ and $V_{IDC-1}$-$V_{IDC-8}$ extend through the layers 210, 212, 214, 216 of the circuit board 140 to provide electrical connections therebetween. Conductive tracks $T_1$-$T_8$ provide the electrical between the respective vias $V_{ECM-1}$-$V_{ECM-8}$ and $V_{IDC-1}$-$V_{IDC-8}$, and thus between the electrical connection members $ECM_1$-$ECM_8$ and insulation displacement connector blades $IDC_1$-$IDC_8$ received thereby.

The example circuit board 140 includes structures for compensating for near end crosstalk. In certain embodiments, the structures for compensating for near end crosstalk include capacitive couplings. The capacitive couplings may be provided, for example, by sets of opposing, generally parallel capacitive plates located at adjacent ones of certain conductive layers. Near end crosstalk and far end crosstalk are particularly problematic between the 4-5 and 3-6 conductor pairs.

As shown in FIG. 15, the circuit board 140 includes the first conductive layer 216 and the second conductive layer 214, with the dielectric layer 220 situated therebetween. In some disclosed examples, the cross-talk compensation arrangement has capacitive couplings formed by conductive plates on the layers 214 and 216, with the dielectric layer 220 separating the conductive plates. Further, one plate on one of the layers 216 forms two separate capacitive couplings with two conductive plates on the second layer 214.

Figure 13:
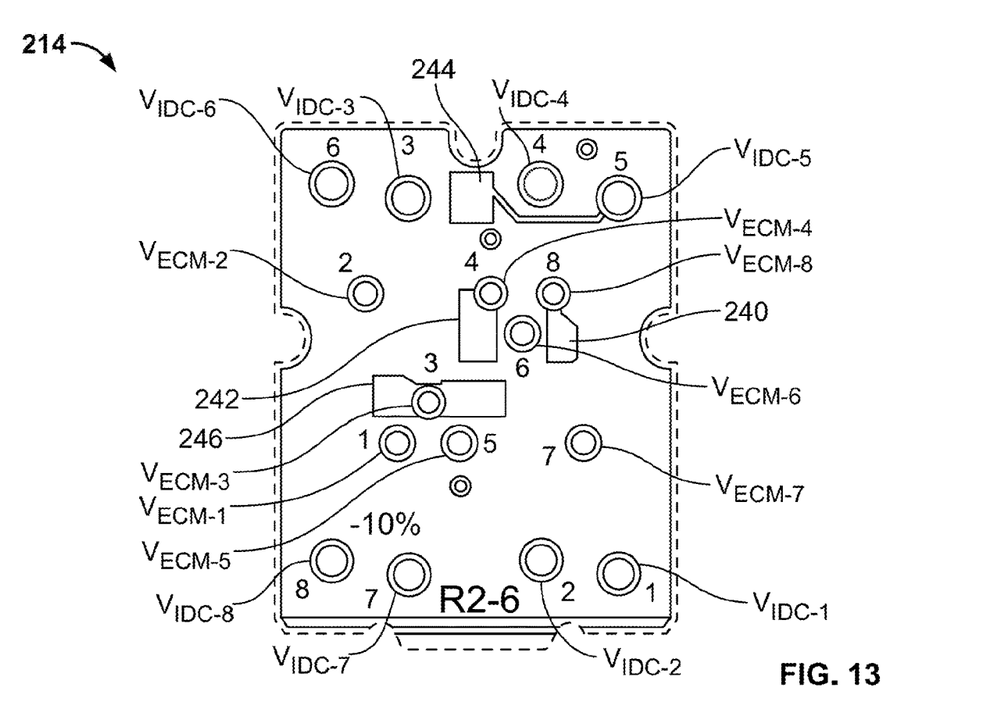
FIG. 13 shows a conductive pathway layout for a bottom-middle inner layer of the compensation circuit board of FIG. 10.
Figure 14:
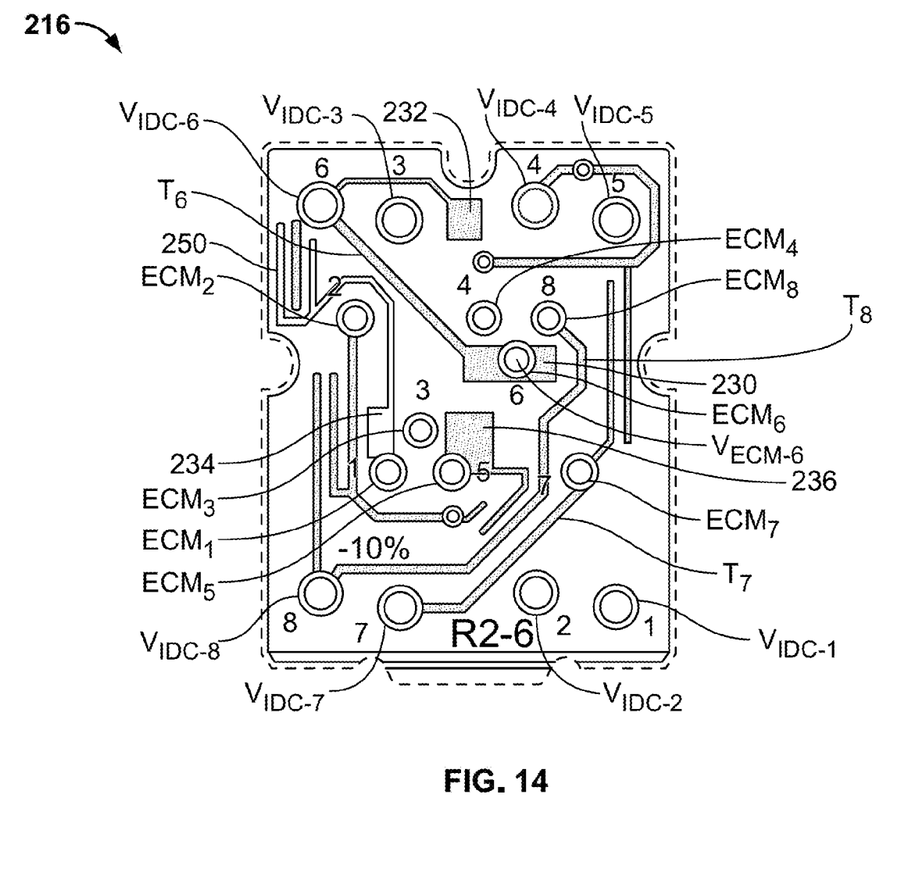
FIG. 14 shows a conductive pathway layout for a bottom layer of the compensation circuit board of FIG. 10.
Figure 15:
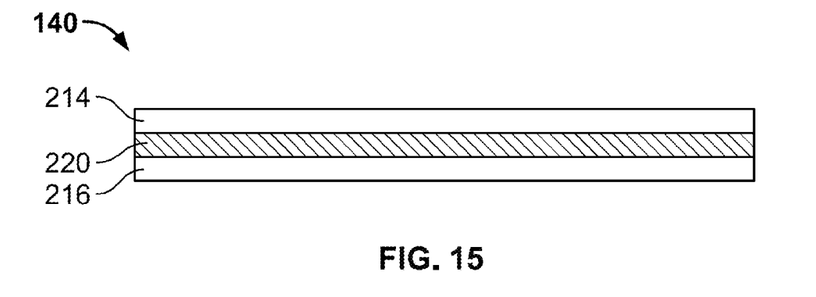
FIG. 15 schematically shows two conductive layers separated by a dielectric layer for the compensation circuit board of FIG. 10.

More specifically, the example cross-talk compensation arrangement has a first capacitive coupling formed by a first conductive plate, such as the plate 230 on the bottom layer 216 shown in FIG. 14, and a second conductive plate 240 on the bottom-middle layer 214 shown in FIG. 13. Further, a second capacitive coupling is formed by the first conductive plate 230 and a third conductive plate 242, which is also on the bottom-middle layer 214. Thus, as shown in FIG. 10, the single conductive plate 230 overlaps with, and forms two capacitors with the second conductive plate 240 and the third conductive plate 242, respectively. In the illustrated example, the first conductive plate 230 is electrically connected to an electrical conductor $ECM_6$ of differential pair 2 (3-6 pair), the second conductive plate 240 is electrically connected to an electrical conductor $ECM_8$ of differential pair 4 (7-8 pair), and the third conductive plate 242 is electrically connected to an electrical conductor $ECM_4$ of a differential pair 2 (4-5 pair). Further, as shown in FIG. 14, the via $V_{ECM-6}$ that receives the ECM $ECM_6$ is surrounded by the conductive plate 230. As shown in FIG. 14, the entire via $V_{ECM-6}$ is surrounded by the conductive plate 230.

The bottom layer 216 further includes additional conductive plates 232, 234 and 236, and the middle-bottom layer 214 further includes conductive plates 244 and 246. As shown in FIG. 10, the conductive plate 246 forms two additional capacitive couplings with the plates 234 and 236, respectively, of the bottom layer 216. The conductive plate 246 is electrically connected to an electrical conductor $ECM_3$ of differential pair 2 (3-6 pair), the conductive plate 234 is electrically connected to an electrical conductor $ECM_1$ of differential pair 3 (1-2 pair), and the conductive plate 236 is electrically connected to an electrical conductor $ECM_5$ of differential pair 1 (4-5 pair).

As best shown in FIG. 13, the plate 246 completely surrounds the via $V_{ECM-3}$. The plates 240 and 242 only partially surround vias $V_{ECM-4}$ and $V_{EVM-8}$. The conductive plates 230, 234, and 236, and the conductive plates 240, 242, 244 and 246 each have perimeter that defines an area. Further, the perimeters of the respective conductive plates 230, 234, and 236, and the conductive plates 240, 242, 244 and 246 are generally rectangular, and the perimeters include width and length dimensions, both of which are larger than the width of the width of the conductive tracks $T_1$-$T_8$. In some embodiments, the area defined by the first conductive plate (e.g., plates 230 and 246) forming two capacitive couplings with respective second and third conductive plates (e.g. plates 240,242, and 234,236) is larger than at least one of the second and third conductive plate areas.

The via $V_{ECM-3}$ is completely within the perimeter of the conductive plate 246, and the via $V_{ECM-6}$ is completely within the perimeter of the conductive plate 230. In contrast, a portion of each of the vias $V_{ECM-4}$ and $V_{EVM-8}$ extends outside the perimeter of plates 240 and 242, and thus are only partially surrounded by the plates 240 and 242. Similarly, the vias $V_{ECM-1}$ and $V_{ECM-5}$ are only partially within the respective perimeters of the plates 234 and 236. As shown in FIGS. 13 and 14, the via $V_{ECM-3}$ is inwardly offset from the width perimeter edge (the shorter dimension) of the conductive plate 246 by a distance greater than the diameter of the via $V_{ECM-3}$. Similarly, the via $V_{ECM-6}$ is inwardly offset from the width perimeter edge of the respective conductive plate 230 by a distance greater than its diameter. In other examples, the surrounded vias are inwardly offset from the perimeter edge of the respective conductive plate by a distance equal to or greater than the via's diameter. In still further examples, the surrounded via is inwardly offset from the width perimeter edge of the respective conductive plate by a distance equal to or greater than 10 percent of the length (the larger dimension) of the conductive plate.

In some examples, the cross-talk compensation arrangement includes additional capacitive couplings formed by inter-digitated capacitor fingers 250. The inter-digitated capacitor fingers 250 shown in FIGS. 10 and 14 form capacitive couplings on a single layer, unlike the capacitive couplings previously discussed formed by conductive plates on adjacent layers of the circuit board 140. The inter-digitated capacitor fingers 250 each define a width that is less than the width of the conductive tracks $T_1$-$T_8$.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A telecommunications connector comprising:
  a plurality of electrical conductors arranged in differential pairs;
  a circuit board having a first conductive layer and a second conductive layer, and a first dielectric layer situated between the first and second conductive layers,
  a cross-talk compensation arrangement for applying capacitance between at least some of the electrical conductors, the cross-talk compensation arrangement including a first capacitive coupling formed by a first conductive plate on the first conductive layer and a second conductive plate on the second conductive layer, and a second capacitive coupling formed by the first conductive plate and a third conductive plate on the second conductive layer.

2. The telecommunications connector of claim 1, wherein the first conductive plate overlaps the second and third conductive plates.

3. The telecommunications connector of claim 1, wherein the cross-talk compensation arrangement includes a third capacitive coupling having inter-digitated capacitor fingers.

4. The telecommunications connector of claim 3, further comprising:
  a plurality of conductive vias extending through the circuit board;
  a plurality of electrical connection members received by respective ones of the plurality of conductive vias;
  a plurality of wire termination contacts received by respective ones of the plurality of conductive vias; and
  a plurality of conductive tracks electrically connecting selected ones of the plurality of conductive vias so as to electrically connect the plurality of electrical connection members and the plurality of wire termination contacts;
  wherein a first one of the conductive vias is at least partially surrounded by the first conductive plate.

5. The telecommunications connector of claim 4, wherein the conductive tracks each define a first width, and the first conductive plate defines a second width that is at least two-times greater than the first width.

6. The telecommunications connector of claim 4, wherein the conductive tracks each define a first width, and the inter-digitated capacitor fingers each define a second width that is less than the first width.

7. The telecommunications connector of claim 1, wherein the first and second capacitive couplings connect between different wires of a first one of the differential pairs and a second one of the differential pairs.

8. The telecommunications connector of claim 7, wherein the first wire pair is a 3-6 wire pair and the second wire pair is a 4-5 wire pair.

9. The telecommunications connector of claim 1, wherein the circuit board further includes third and fourth conductive layers, wherein the first conductive layer is a bottom layer.

10. The telecommunications connector of claim 1, wherein the wire termination contacts are insulation displacement connectors.

11. The telecommunications connector of claim 1, wherein the first conductive plate defines a first area, the second conductive plate defines a second area, and the third conductive plate defines a third area, wherein the second area is less than the first area.

12. The telecommunications connector of claim 10, wherein the third area is less than the first area.

13. The telecommunications connector of claim 1, wherein the first conductive plate is electrically connected to a first electrical conductor of a first differential pair, the second conductive plate is electrically connected to a second electrical conductor of a second differential pair, and the third conductive plate is electrically connected to a third electrical conductor of a third differential pair.

14. A telecommunications connector comprising:
a housing defining a port for receiving a plug;
a circuit board having a first conductive layer and a second conductive layer, and a dielectric layer situated between the first and second conductive layers,
a plurality of conductive vi as extending through the circuit board;
a plurality of electrical connection members received by respective ones of the plurality of conductive vias;
a plurality of wire termination contacts received by respective ones of the plurality of conductive vias;
a plurality of conductive tracks electrically connecting selected ones of the plurality of conductive vias to electrically connect the plurality of electrical connection members and the plurality of wire termination contacts;
a crosstalk compensation arrangement that provides crosstalk compensation between selected conductive tracks of the circuit board, the crosstalk compensation arrangement including a first capacitive coupling having a first conductive plate on the first conductive layer and a second conductive plate on the second conductive layer, wherein a first one of the conductive vias is at least partially surrounded by the first conductive plate.

15. The telecommunications connector of claim 14, wherein the first one of the conductive vias is completely surrounded by the first conductive plate.

16. The telecommunications connector of claim 14, further comprising a second capacitive coupling having a third conductive plate on the second conductive layer, wherein the first conductive plate overlaps the second and third conductive plates.

17. The telecommunications connector of claim 14, wherein the electrical connection members extend from the first layer.

18. The telecommunications connector of claim 14, wherein:
the circuit board further includes third and fourth conductive layers;
the first conductive layer is a bottom layer;
fourth conductive layer is a top layer;
the second and third conductive layers are middle layers positioned between the top and bottom layers;
the electrical connection members extend from the bottom layer; and
the wire termination contacts extend from the top layer.

19. The telecommunications connector of claim 15, wherein:
the plurality of conductive vias include a plurality of first conductive vias receiving the respective ones of the plurality of the electrical connection members, and a plurality of second conductive vias receiving the respective ones of the plurality of wire termination contacts; and
the plurality of conductive tracks electrically connect the plurality of first conductive vias to respective ones of the second conductive vias.

20. The telecommunications connector of claim 15, wherein the first via is inwardly offset from a perimeter edge of the first conductive plate by a distance equal to or greater than a diameter of the first via.

21. The telecommunications connector of claim 15, wherein the first conductive plate is rectangular, and wherein the first via is inwardly offset from a width perimeter edge of the first conductive plate by a distance equal to or greater than 1.0 percent of a length of the first conductive plate.

22. A telecommunications connector comprising:
a housing defining a port for receiving a plug;
a circuit board having a bottom layer, a bottom-middle layer, a top-middle layer and a top conductive layer, wherein the bottom-middle layer is between the bottom layer and the top-middle layer, and the top middle layer is between the top layer and the bottom middle layer;
a dielectric layer between the bottom and the bottom-middle layers,
a plurality of first conductive vias extending through the circuit board;
a plurality of second conductive vias extending through the circuit board;
a plurality of electrical connection members received by respective ones of the plurality, of first conductive vias and extending from the bottom layer;
a plurality of wire termination contacts received by respective ones of the plurality of second conductive vias and extending from the top layer;
a plurality of conductive tracks on the top and bottom layers electrically connecting the plurality of first conductive vias to respective ones of the plurality of second conductive vias;
a crosstalk compensation arrangement that provides crosstalk compensation between selected ones of the plurality of conductive tracks, the crosstalk compensation arrangement including a first capacitive coupling formed by a first conductive plate on the bottom layer and a second conductive plate on the bottom-middle layer, and a second capacitive coupling formed by the first conductive plate and a third conductive plate on the bottom-middle layer, wherein the first conductive plate overlaps the second and third conductive plates.

23. The telecommunications connector of claim 22, wherein a first one of the first conductive vias is at least partially surrounded by the first conductive plate.

24. The telecommunications connector of claim 23, wherein the first, second and third conductive plates are all electrically connected to different ones of the first and second conductive vias.

* * * * *